United States Patent
Chang et al.

(10) Patent No.: US 10,349,566 B1
(45) Date of Patent: Jul. 9, 2019

(54) SHIELDING STRUCTURE

(71) Applicant: Wistron NeWeb Corp., Hsinchu (TW)

(72) Inventors: Jen-Yung Chang, Hsinchu (TW); Tiao-Ming Hsu, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 0 days.

(21) Appl. No.: 16/229,046

(22) Filed: Dec. 21, 2018

(30) Foreign Application Priority Data

Dec. 22, 2017 (TW) .............................. 106145274 A

(51) Int. Cl.
*H05K 3/00* (2006.01)
*H05K 9/00* (2006.01)

(52) U.S. Cl.
CPC ......... *H05K 9/0032* (2013.01); *H05K 9/0026* (2013.01)

(58) Field of Classification Search
CPC ....... H05K 9/0032; H05K 2201/10371; H05K 2201/09972; H05K 9/0024; H05K 9/0037; H05K 9/0026
See application file for complete search history.

(56) References Cited

U.S. PATENT DOCUMENTS

| 6,545,871 B1* | 4/2003 | Ramspacher | ...... H05K 7/20445 165/185 |
| 2008/0080160 A1* | 4/2008 | English | ................ H05K 9/0032 361/818 |
| 2010/0149780 A1* | 6/2010 | Ren | ...... H05K 9/0032 361/818 |
| 2012/0008302 A1* | 1/2012 | Lin | ...... H05K 9/0026 361/818 |
| 2013/0033843 A1* | 2/2013 | Crotty, Jr. | ............ H05K 9/0032 361/807 |

FOREIGN PATENT DOCUMENTS

| KR | 10-1326552 B1 | 11/2013 |
| TW | M380705 U | 5/2010 |

\* cited by examiner

*Primary Examiner* — James Wu
(74) *Attorney, Agent, or Firm* — McClure, Qualey & Rodack, LLP

(57) ABSTRACT

A shielding structure is provided. The shielding structure is adapted to be disposed on a circuit board. The shielding structure includes a main beam, a branch beam and a shielding cover. The main beam is affixed to the circuit board, wherein the main beam includes a main beam body and a main beam connection unit, the main beam connection unit is disposed on the main beam body. The branch beam includes a branch beam body and a branch beam connection unit, wherein the branch beam connection unit is disposed on the branch beam body, the branch beam connection unit is connected to the main beam connection unit, and the main beam connection unit is partially located between the branch beam connection unit and the circuit board. The shielding cover includes a cover portion and a surrounding wall which is bent from the cover portion.

16 Claims, 13 Drawing Sheets

SHIELDING STRUCTURE

CROSS REFERENCE TO RELATED APPLICATIONS

This Application claims priority of Taiwan Patent Application No. 106145274, filed on Dec. 22, 2017, the entirety of which is incorporated by reference herein.

BACKGROUND OF THE INVENTION

Field of the Invention

The present invention relates to a shielding structure, and in particular to a shielding structure with more freedom of design.

Description of the Related Art

Shielding structures are commonly utilized in various electronic products to reduce electromagnetic interference. A conventional shielding structure is formed by stamping a sheet metal. The sheet metal is stamped with a stamping die, and is bent to form a plurality of compartments. However, to bend the sheet metal, a sufficient stamping die gap is reserved, and the compartments therefore have increased gap formed thereon. Additionally, a conventional shielding structure can be utilized on a single electronic product, and the compartment design cannot be changed. When the layout on the circuit board is changed, the shielding structure needs to be redesigned, and a new stamping die for the redesigned shielding structure is required.

BRIEF SUMMARY OF THE INVENTION

In one embodiment, a shielding structure is provided. The shielding structure is adapted to be disposed on a circuit board. The shielding structure comprises a main beam, a branch beam, and a shielding cover. The main beam is affixed to the circuit board, wherein the main beam comprises a main beam body and a main beam connection unit formed on the main beam body, and the two ends of the main beam body are free ends. The branch beam comprises a branch beam body and a branch beam connection unit formed on the branch beam body, the branch beam connection unit is connected to the main beam connection unit, and a part of the main beam connection unit is located between the branch beam connection unit and the circuit board, and the two ends of the branch beam body are free ends. The shielding cover comprises a cover portion and a surrounding wall bent from the cover portion, wherein the shielding cover covers the main beam and the branch beam, and is connected to the circuit board via the surrounding wall.

Utilizing the shielding structure of the embodiment, the combination of the main beam and the branch beam can be modified according to the element arrangement on the circuit board to provide different spatial divisions. The shielding structure of the embodiment provides more freedom of design than the conventional method of dividing space by bending the metal sheet. Additionally, the main beam is tightly combined with the branch beam, the gap therebetween is reduced, and the electromagnetic wave shielding effect of the shielding structure is improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
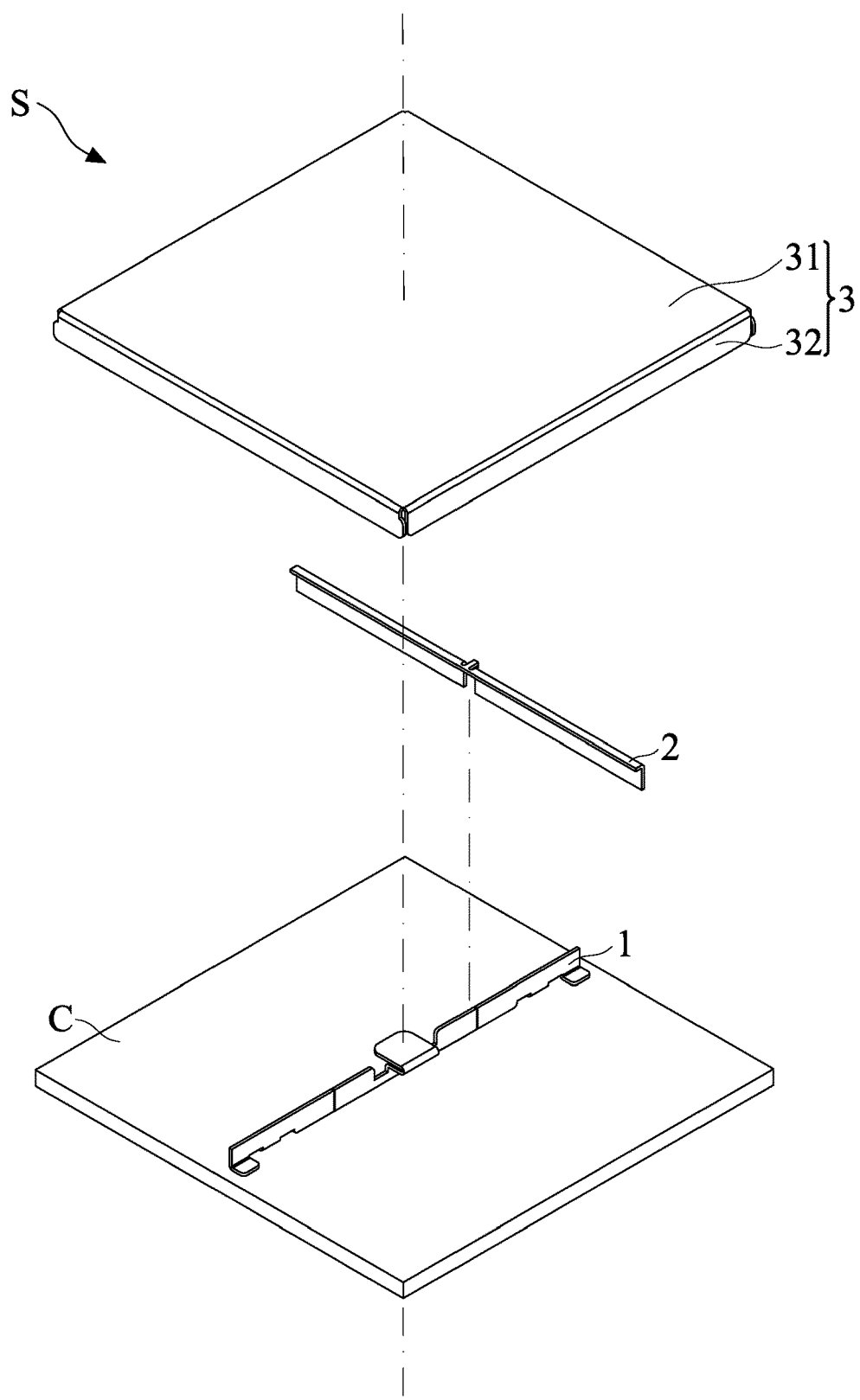
FIG. 1 shows a shielding structure of a first embodiment of the invention.
Figure 2A:
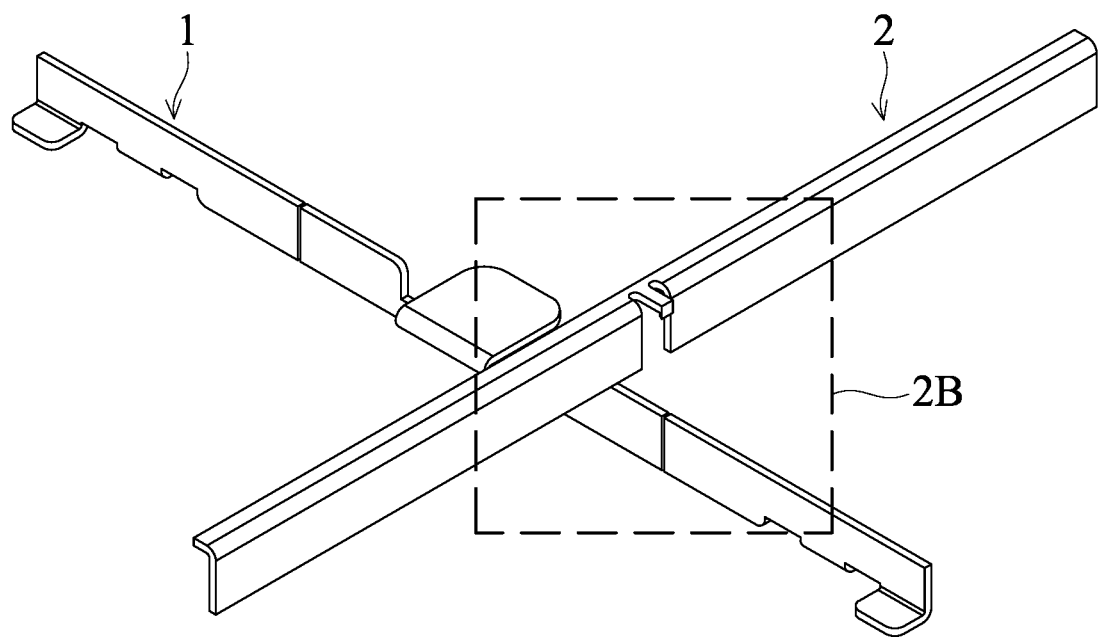
FIG. 2A shows details of a main beam and a branch beam of the first embodiment of the invention.
Figure 2B:
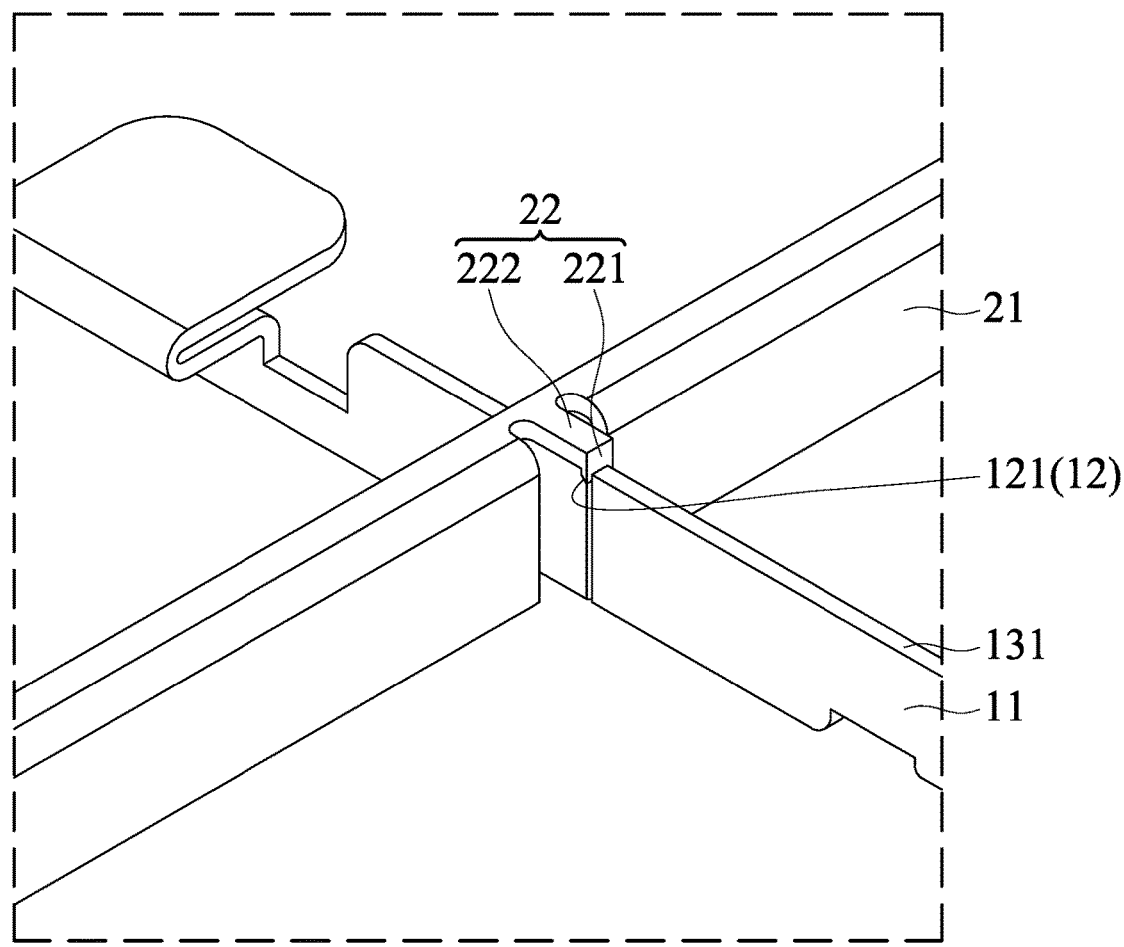
FIG. 2B is an enlarged view of portion 2B in FIG. 2A.

FIG. 1 shows a shielding structure S of a first embodiment of the invention. With reference to FIG. 1, the shielding structure S is adapted to be disposed on a circuit board C. The shielding structure S comprises a main beam 1, a branch beam 2 and a shielding cover 3. The main beam 1 is affixed to the circuit board C. FIG. 2A shows details of the main beam and the branch beam. FIG. 2B is an enlarged view of the portion 2B of FIG. 2A. With reference to FIGS. 2A and 2B, the main beam 1 comprises a main beam body 11 and a main beam connection unit 12. The main beam connection unit 12 is disposed on the main beam body 11. The branch beam 2 comprises a branch beam body 21 and a branch beam connection unit 22. The branch beam connection unit 22 is disposed on the branch beam body 21. The branch beam connection unit 22 is connected to the main beam connection unit 12. The main beam connection unit 12 is partially located between the branch beam connection unit 22 and the circuit board C. The shielding cover 3 comprises a cover portion 31 and a surrounding wall 32 which is bent from the cover portion 31. The shielding cover 3 covers the main beam 1 and the branch beam 2, and is connected to the circuit board C via the surrounding wall 32.

With reference to FIG. 2B, in one embodiment, the main beam connection unit 12 comprises a main beam engaging portion 121. The branch beam connection unit 22 comprises a branch beam engaging portion 221. The branch beam engaging portion 221 engages the main beam engaging portion 121. In this embodiment, the main beam engaging portion 121 is formed on a top surface 131 of the main beam body 11 opposite to the circuit board C. The main beam engaging portion 121 is a V-shaped groove. The branch beam engaging portion 221 is a protrusion. The branch beam engaging portion 221 is combined with the main beam engaging portion 121 in a first direction Z. The first direction Z is perpendicular to the circuit board C. In this embodiment, the branch beam connection unit 22 comprises an extending arm 222. The extending arm 222 extends in a main beam extending direction X of the main beam 1, and the branch beam engaging portion 221 is formed on one end of the extending arm 222.

Figure 3A:
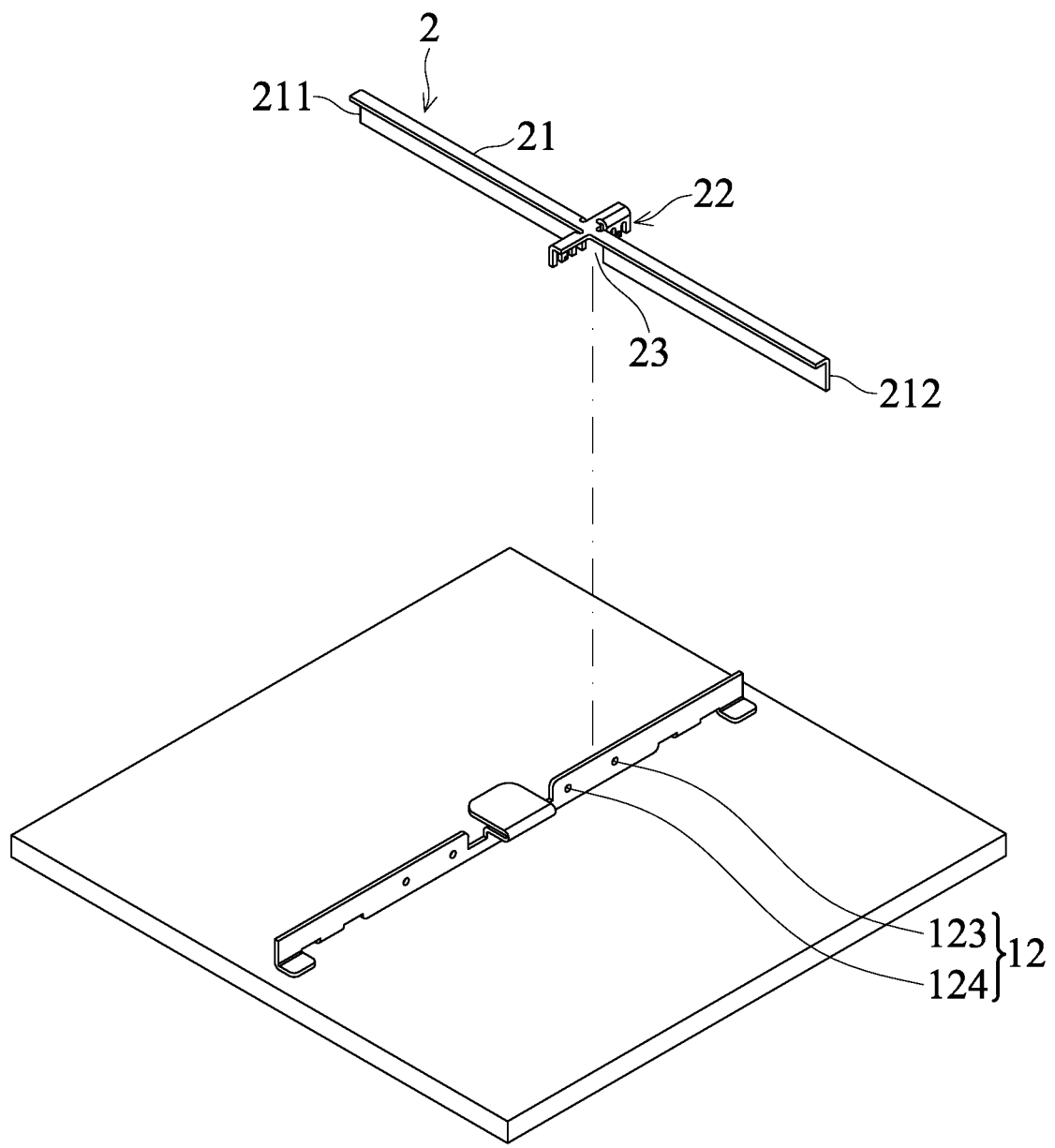
FIG. 3A shows a main beam and a branch beam of a second embodiment of the invention.
Figure 3B:
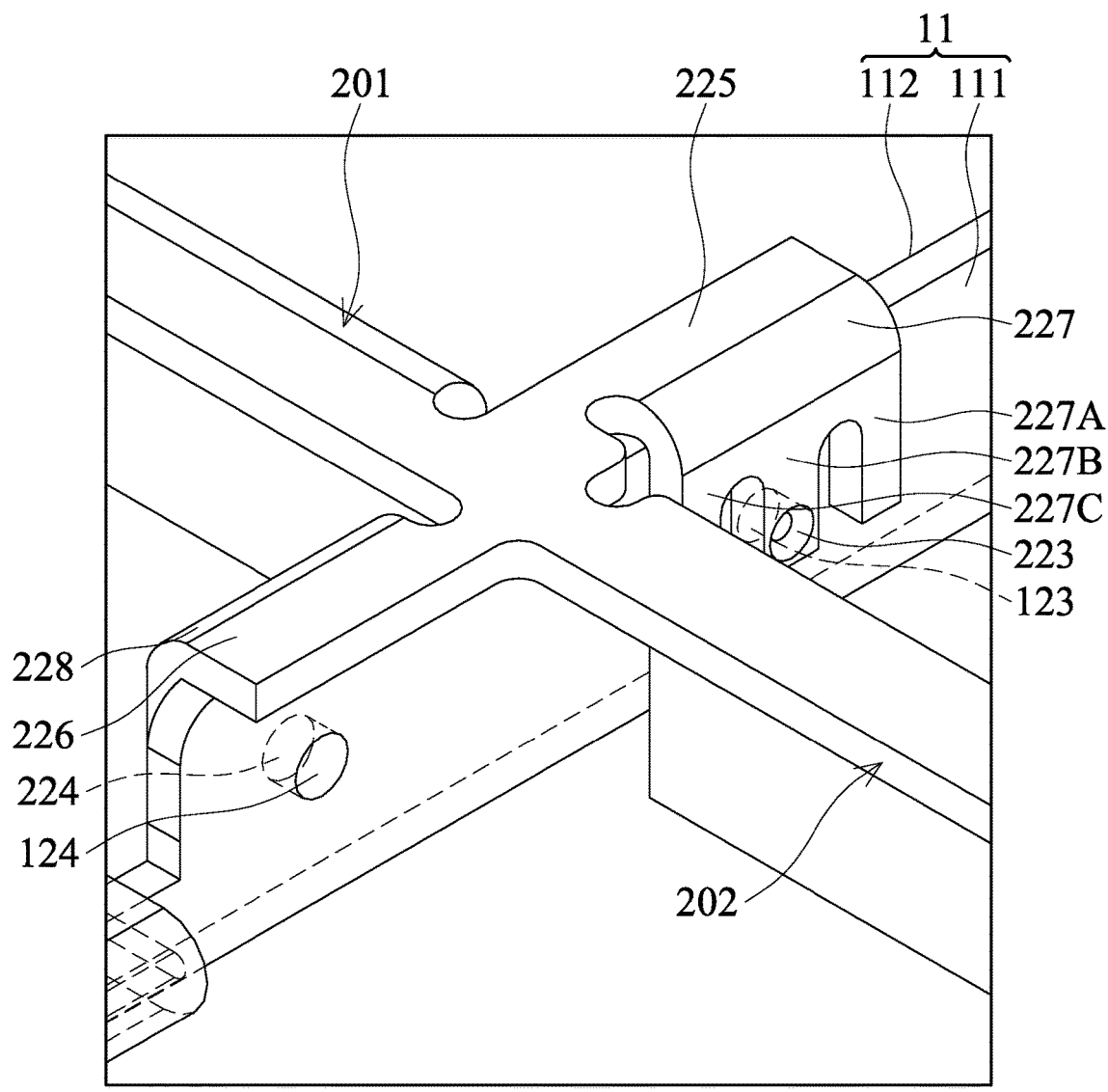
FIG. 3B shows the main beam being combined with the branch beam of the second embodiment of the invention.

FIG. 3A shows a main beam and a branch beam of a second embodiment of the invention. FIG. 3B shows the main beam being combined with the branch beam of the second embodiment of the invention. With reference to FIGS. 3A and 3B, in one embodiment, the main beam body 11 comprises a first surface 111 and a second surface 112. The first surface 111 is opposite to the second surface 112. The main beam connection unit 12 comprises a first main beam engaging portion 123 and a second main beam engaging portion 124. The first main beam engaging portion 123 is at least formed on the first surface 111. The second main beam engaging portion 124 is at least formed on the second surface 112. In particular, the first main beam engaging portion 123 and the second main beam engaging portion 124 respectively passes through the first surface 111 and the second surface 112. However, the disclosure is not meant to restrict the invention. The branch beam connection unit 22 comprises a first branch beam engaging portion 223 and a second branch beam engaging portion 224. The first branch beam engaging portion 223 is connected to the first main beam engaging portion 123, and the second branch beam engaging portion 224 is connected to the second main beam engaging portion 124.

As mentioned, the first main beam engaging portion 123 and the second main beam engaging portion 124 can be through holes or blind holes. The first branch beam engaging portion 223 and the second branch beam engaging portion 224 can be a quarter-sphere structure or half-sphere structure. The disclosure is not meant to restrict the invention.

With reference to FIGS. 3A and 3B, in one embodiment, the branch beam connection unit 22 comprises a first extending arm 225, a second extending arm 226, a first connection portion 227 and a second connection portion 228. The first extending arm 225 is disposed on a first side 201 of the branch beam body 21. The second extending arm 226 is disposed on a second side 202 of the branch beam body 21. The extending direction of the second extending arm 226 is opposite to the extending direction of the first extending arm 225. The first connection portion 227 bent from the first extending arm 225. The second connection portion 228 is bent from the second extending arm 226. The first branch beam engaging portion 223 is formed on the first connection portion 227, and the second branch beam engaging portion 224 is formed on the second connection portion 228.

The details of the first connection portion and the second connection portion are described as follows with the first connection portion as an example. With reference to FIG. 3B, in one embodiment, the first connection portion 227 comprises a comb-shaped structure, and the first branch beam engaging portion 223 is formed on the comb-shaped structure. In one embodiment, the comb-shaped structure comprises a first tooth 227A, a second tooth 227B and a third tooth 227C. The second tooth 227B is located between the first tooth 227A and the third tooth 227C. The first branch beam engaging portion 223 is formed on the second tooth 227B.

With reference to FIG. 3A, in one embodiment, the branch beam body 21 comprises a first end 211 and a second end 212. The branch beam connection unit 22 is disposed between the first end 211 and the second end 212. A notch 23 is formed below the branch beam connection unit 22. In this embodiment, the two ends of the main beam body 11 and the two ends of the branch beam body 21 are free ends.

Figure 4A:
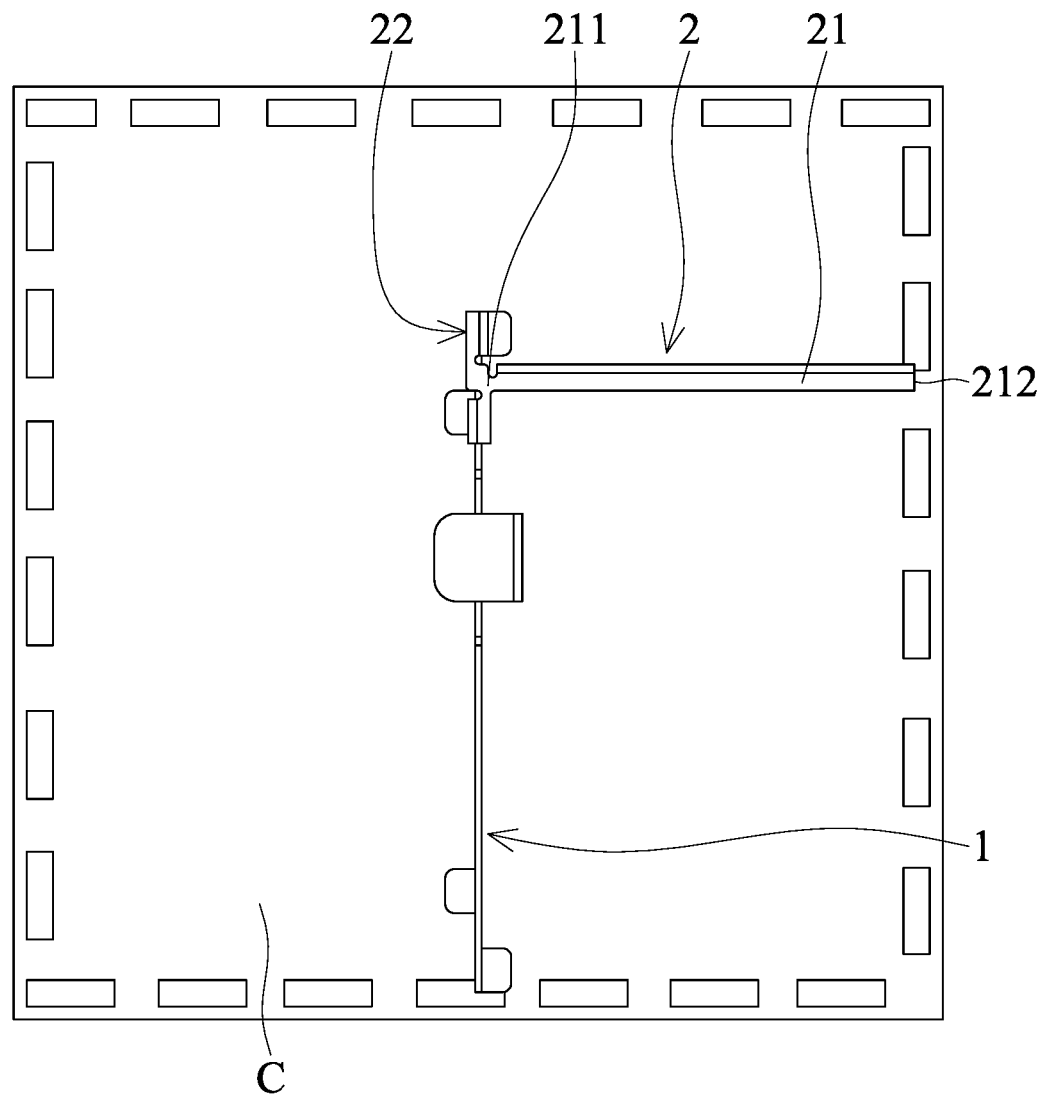
FIG. 4A shows the main beam and the branch beam forming an L-shaped structure.
Figure 4B:
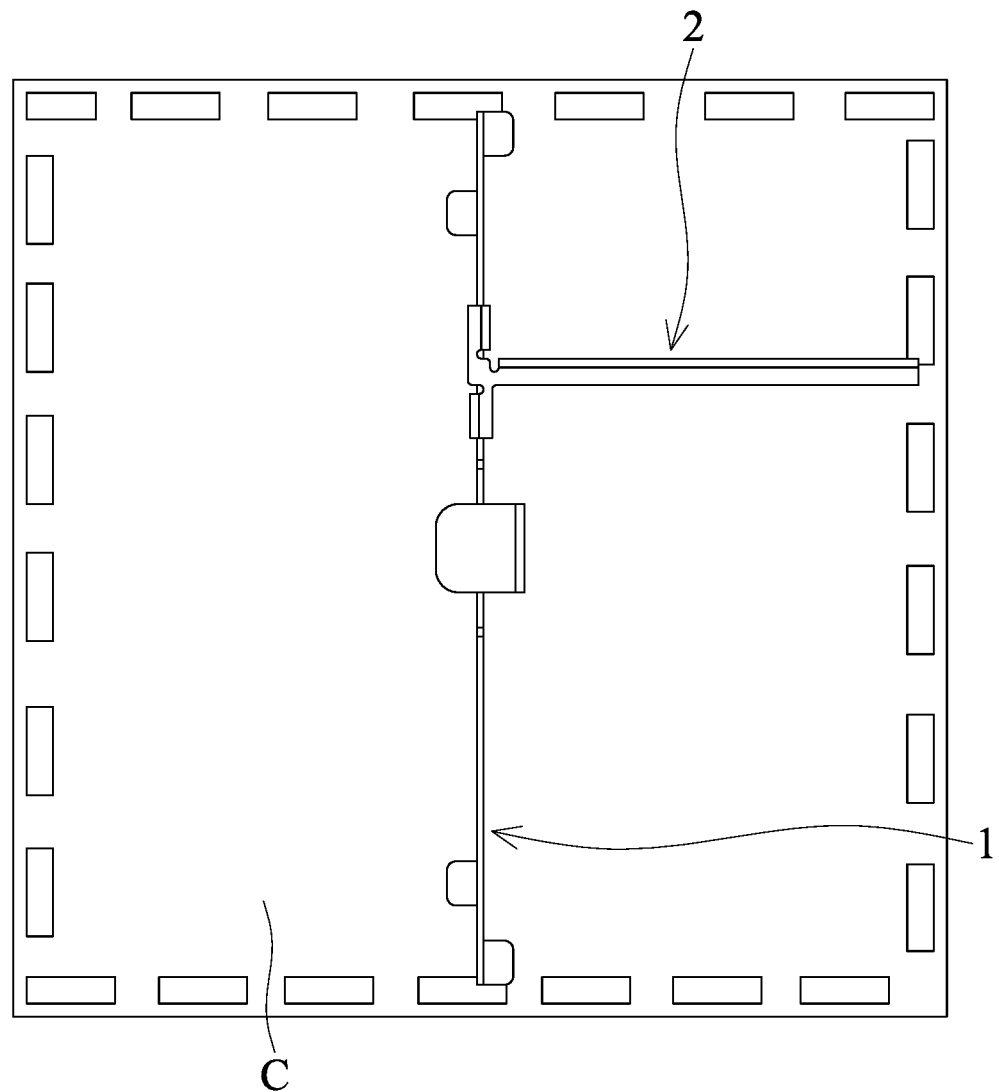
FIG. 4B shows the main beam and the branch beam forming a T-shaped structure.

With reference to FIG. 4A, in another embodiment, the branch beam body 21 comprises a first end 211 and a second end 212, and the branch beam connection unit 22 is disposed on the first end 211. In this embodiment, the main beam 1 and the branch beam 2 form an L-shaped structure. With reference to FIG. 4B, in another embodiment, the main beam 1 and the branch beam 2 form a T-shaped structure.

Utilizing the shielding structure S of the embodiment, the combination of the main beam 1 and the branch beam 2 can be modified according to the element arrangement on the circuit board to provide different spatial divisions. The shielding structure S of the embodiment provides more freedom of design than the conventional method of dividing space by bending the metal sheet. Additionally, the main beam 1 is tightly combined with the branch beam 2, the gap therebetween is reduced, and the electromagnetic wave shielding effect of the shielding structure is improved.

In one embodiment, the main beam 1 and the branch beam 2 come in many different sizes, for automated assembly. Unlike conventional methods of dividing space that involve bending the metal sheet, the combination of the main beam 1 and the branch beam 2 can be modified to suit manufacturing needs. The design of the shielding structure can be modified without being restricted by the time and cost of producing the stamping die.

Additionally, in the embodiment of the invention, the main beam 1 and the branch beam 2 are not surrounded by a frame. Therefore, when the shielding cover is combined with the main beam 1 and the branch beam 2, the shielding cover is prevented from being mechanically interfered with by the frame. The height of the shielding structure can be reduced.

Figure 5A:
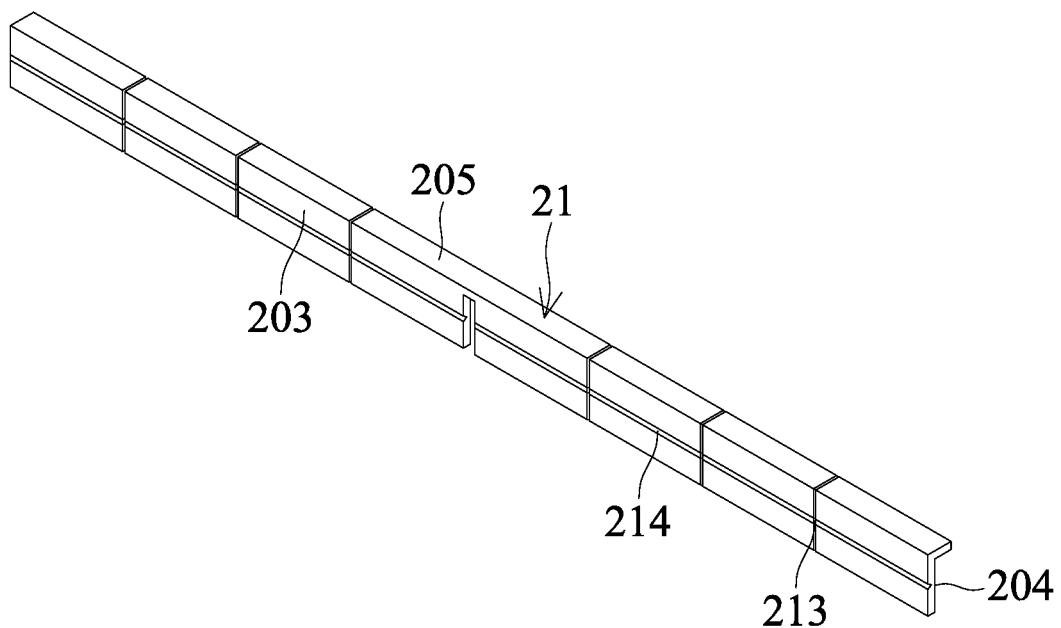
FIG. 5A shows a branch beam body of the first embodiment of the invention, wherein cuts are formed thereon.
Figure 5B:
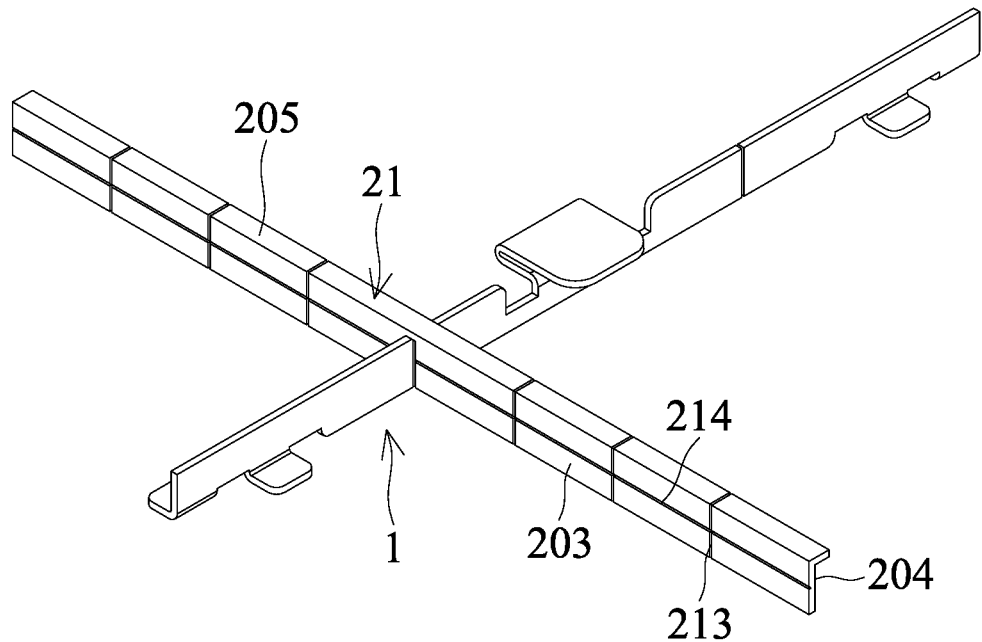
FIG. 5B shows the main beam body being combined with the branch beam body of the embodiment of FIG. 5A.

With reference to FIGS. 5A and 5B, in one embodiment, a plurality of cuts 213 are formed on the branch beam body 21. The cuts 213 are equidistantly arranged along the extending direction of the branch beam body 21, and the cuts 213 are parallel to each other. In one embodiment, the branch beam body 21 comprises a first side surface 203, a second side surface 201 and a top surface 205. The second side surface 204 is opposite to the first side surface 203. The top surface 205 is opposite to the circuit board C and is located between the first side surface 203 and the second side surface 204. The top surface 205 is directly connected to the first side surface 203, and the cuts 213 extend to the first side surface 203 and the top surface 205. In one embodiment, an operator can bend or break the branch beam 2 at one of the cuts 213 to change the length of the branch beam 2.

With reference to FIGS. 5A and 5B, in one embodiment, a slot 214 is formed on the branch beam body 21. The slot 214 extends in the extending direction of the branch beam body 21, and is located on the first side surface 203. In one embodiment, an operator can bend or break the branch beam 2 at the slot 214 to change the height of the branch beam 2.

Figure 6:
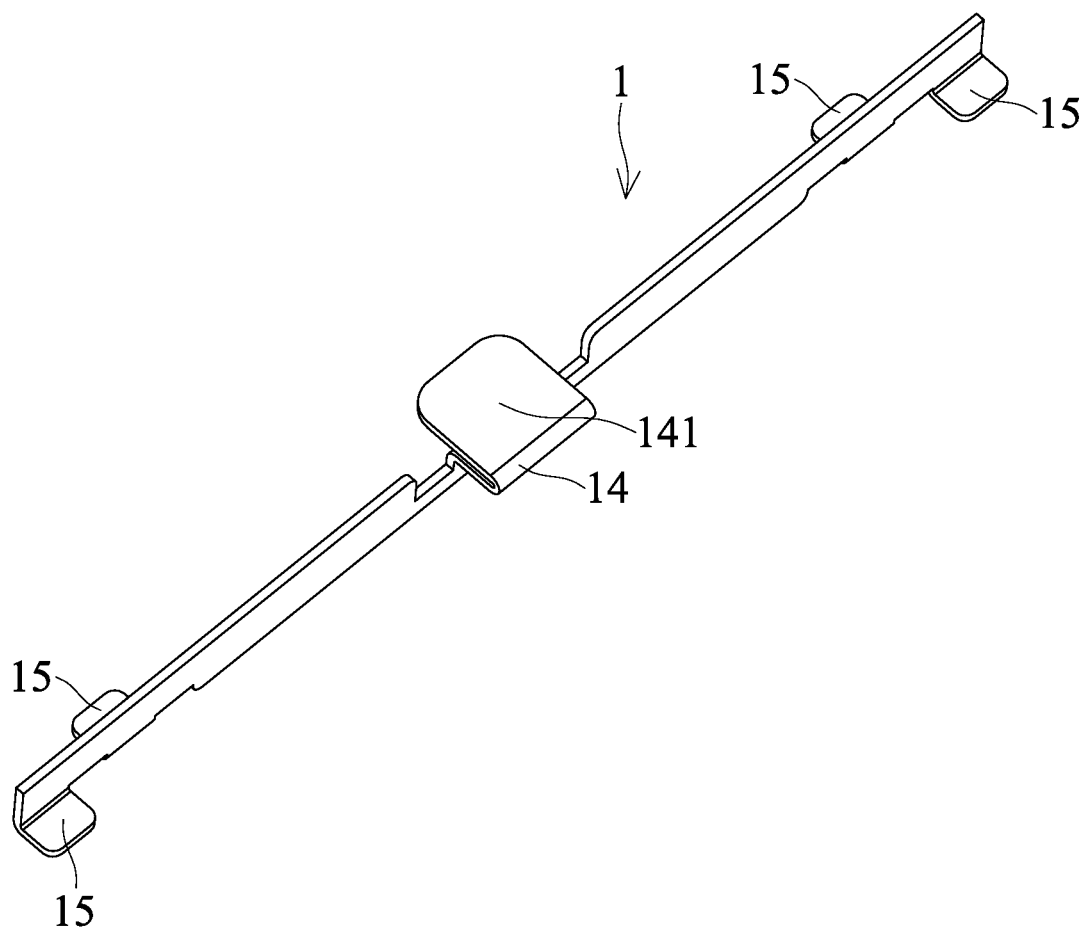
FIG. 6 shows details of the main beam of the embodiment of the invention.

FIG. 6 shows details of the main beam 1. In one embodiment, the main beam 1 further comprises a platform 14. The platform 14 is disposed on the main beam body 11. The platform 14 comprises a planar surface 141. The planar surface 141 is parallel to the circuit board C. A vacuum nozzle can hold the main beam 1 at the planar surface 141. In this embodiment, the main beam 1 comprises a plurality of stands 15. In one embodiment, the stands 15 of the main beam 1 are affixed to the circuit board C by surface welding. Additionally, in some embodiments, the main beam 1 comprises only one pair of stands 15.

Figure 7A:
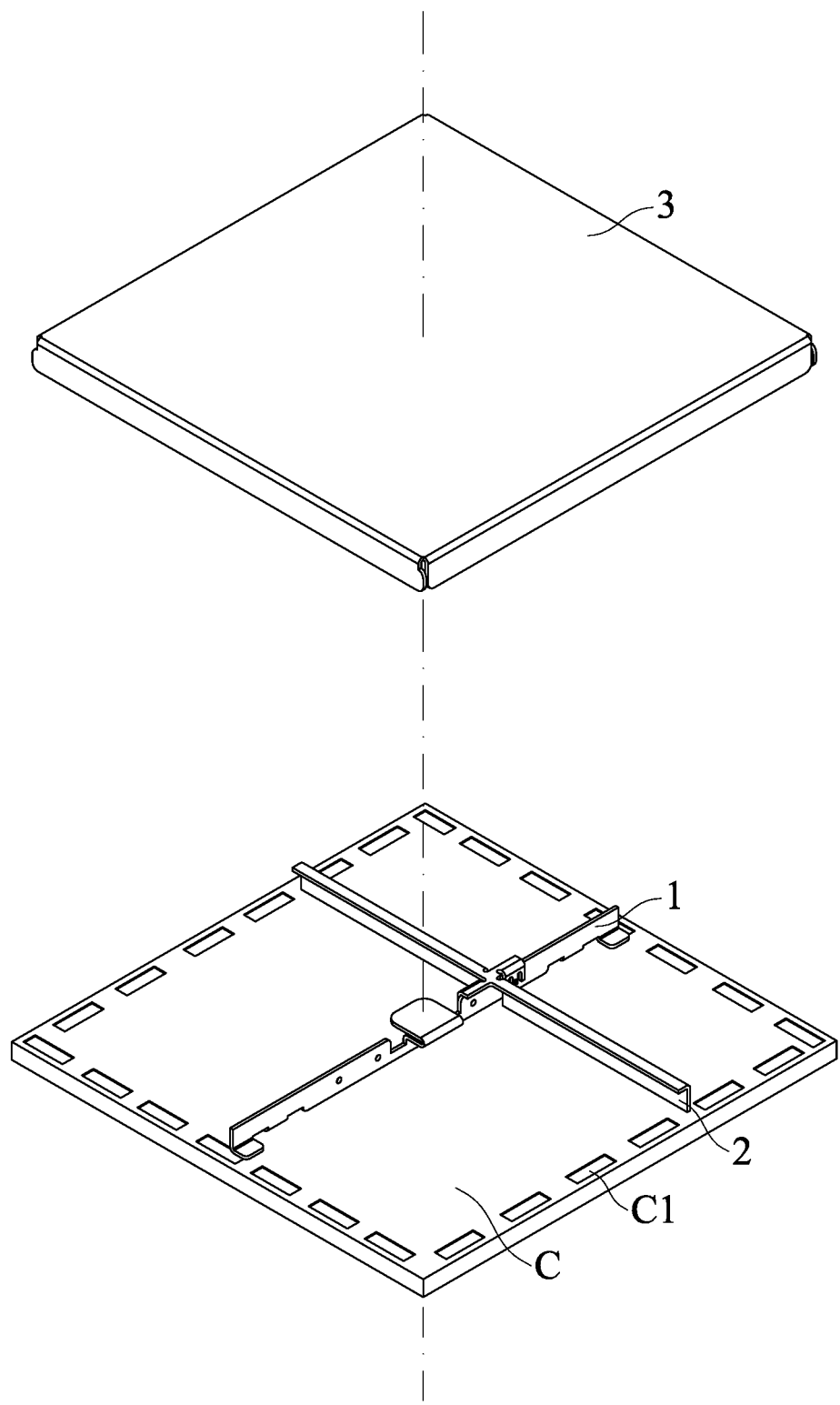
FIG. 7A shows the solder balls pre-formed on the circuit board of the embodiment of the invention.
Figure 7B:
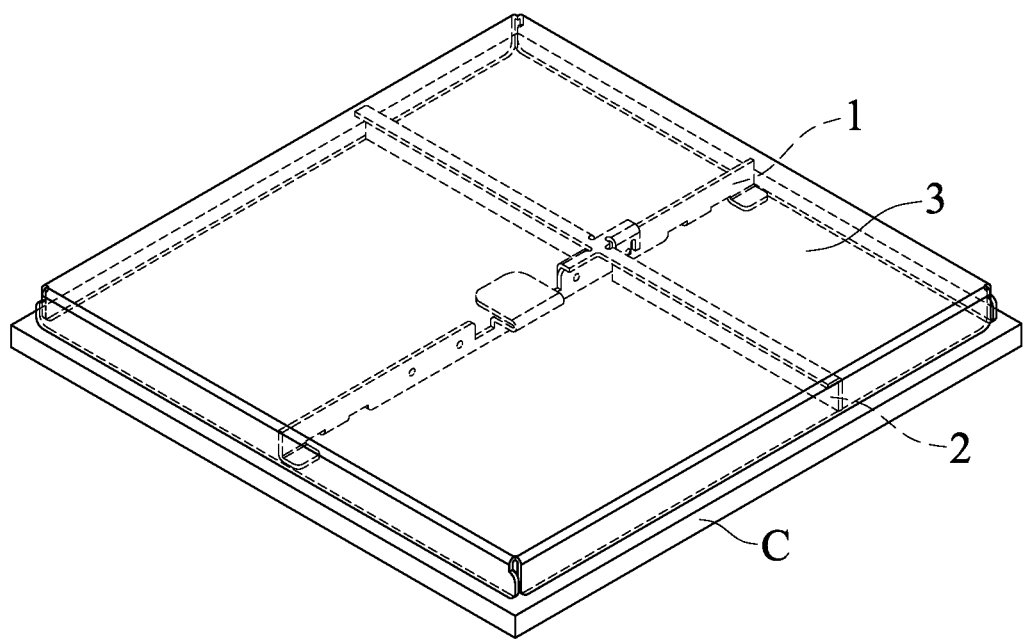
FIG. 7B an embodiment of the invention, wherein the shielding cover is affixed to the circuit board by surface welding.

With reference to FIGS. 7A and 7B, in one embodiment, the shielding cover 3 is affixed to the circuit board C by surface welding. Solder balls C1 can be pre-formed on the circuit board C.

Figure 8:
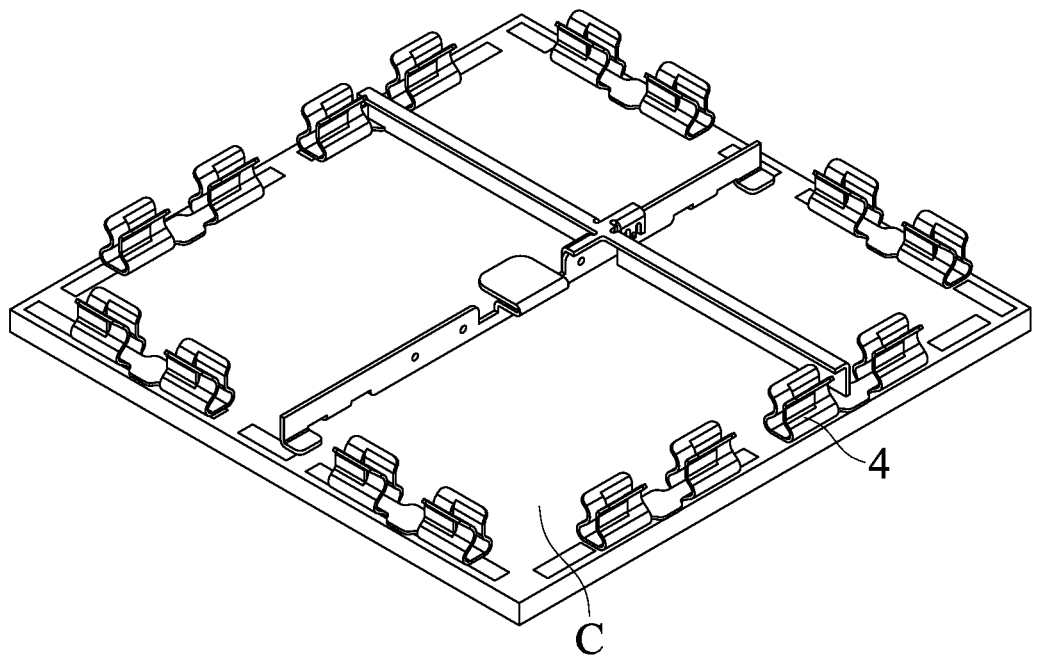
FIG. 8 shows an embodiment of the invention, wherein the shielding structure further comprises a plurality of elastic holders.

With reference to FIG. 8, in another embodiment, the shielding structure further comprises a plurality of elastic holders 4. The elastic holders 4 are affixed to the circuit board C. The shielding cover 3 is held by the elastic holders 4 to be detachably connected to the circuit board C.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shielding structure, for being disposed on a circuit board, comprising:
    a main beam, affixed to the circuit board, wherein the main beam comprises a main beam body and a main beam connection unit formed on the main beam body, and the two ends of the main beam body are free ends;
    a branch beam, comprising a branch beam body and a branch beam connection unit formed on the branch beam body, the branch beam connection unit is connected to the main beam connection unit, and a part of the main beam connection unit is located between the branch beam connection unit and the circuit board, and the two ends of the branch beam body are free ends; and
    a shielding cover, comprising a cover portion and a surrounding wall bent from the cover portion, wherein the shielding cover covers the main beam and the branch beam, and is connected to the circuit board via the surrounding wall.

2. The shielding structure as claimed in claim 1, wherein the main beam connection unit comprises a main beam engaging portion, the branch beam connection unit comprises a branch beam engaging portion, and the branch beam engaging portion engages the main beam engaging portion.

3. The shielding structure as claimed in claim 2, wherein the main beam engaging portion is formed on a top surface of the main beam body opposite to the circuit board, the main beam engaging portion is a V-shaped groove, the branch beam engaging portion is a protrusion, the branch beam engaging portion is connected with the main beam engaging portion in a first direction, and the first direction is perpendicular to the surface of the circuit board.

4. The shielding structure as claimed in claim 3, wherein the branch beam connection unit comprises an extending arm, the extending arm extends in an extending direction of the main beam, and the branch beam engaging portion is formed on an end of the extending arm.

5. The shielding structure as claimed in claim 2, wherein the main beam body comprises a first surface and a second surface, the first surface is opposite to the second surface, the main beam connection unit comprises a first main beam engaging portion and a second main beam engaging portion, the first main beam engaging portion is formed on the first surface, the second main beam engaging portion is formed on the second surface, the branch beam connection unit comprises a first branch beam engaging portion and a second branch beam engaging portion, the first branch beam engaging portion is connected to the first main beam engaging portion, and the second branch beam engaging portion is connected to the second main beam engaging portion.

6. The shielding structure as claimed in claim 5, wherein the branch beam connection unit comprises:
    a first extending arm, disposed on a first side of the branch beam body;
    a second extending arm, disposed on a second side of the branch beam body, wherein an extending direction of the second extending arm is opposite to an extending direction of the first extending arm;
    a first connection portion, bent from the first extending arm; and
    a second connection portion, bent from the second extending arm, wherein the first branch beam engaging portion is formed on the first connection portion, and the second branch beam engaging portion is formed on the second connection portion.

7. The shielding structure as claimed in claim 6, wherein the first connection portion comprises a comb-shaped structure, and the first branch beam engaging portion is formed on the comb-shaped structure.

8. The shielding structure as claimed in claim 7, wherein the comb-shaped structure comprises a first tooth, a second tooth and a third tooth, the second tooth is located between the first tooth and the third tooth, and the first branch beam engaging portion is formed on the second tooth.

9. The shielding structure as claimed in claim 1, wherein the two ends of the branch beam body comprises a first end and a second end, the branch beam connection unit is disposed between the first end and the second end, a notch is formed at a lower side of the branch beam connection unit.

10. The shielding structure as claimed in claim 1, wherein the two ends of the branch beam body comprises a first end and a second end, and the branch beam connection unit is disposed on the first end.

11. The shielding structure as claimed in claim 1, wherein a plurality of cuts are formed on the branch beam body, and the cuts are equidistantly arranged along an extending direction of the branch beam body, and the cuts are parallel to each other.

12. The shielding structure as claimed in claim 11, wherein the branch beam body comprises a first side surface, a second side surface and a top surface, the second side surface is opposite to the first side surface, the top surface is opposite to the circuit board and is located between the first side surface and the second side surface, the top surface is directly connected to the first side surface, and the cuts extend to the first side surface and the top surface.

13. The shielding structure as claimed in claim 1, wherein the main beam further comprises a platform, the platform is disposed on the main beam body, the platform comprises a planar surface, and the planar surface is parallel to the circuit board.

14. The shielding structure as claimed in claim 1, wherein the main beam is affixed to the circuit board by surface welding, and the branch beam is detachably connected to the main beam.

15. The shielding structure as claimed in claim 1, wherein the shielding cover is affixed to the circuit board by surface welding.

16. The shielding structure as claimed in claim 1, further comprising a plurality of elastic holders, wherein the elastic holders are affixed to the circuit board, the shielding cover is held by the elastic holders to be detachably connected to the circuit board.

* * * * *